(12) United States Patent
Kakutaka et al.

(10) Patent No.: US 11,542,418 B2
(45) Date of Patent: Jan. 3, 2023

(54) EPOXY RESIN COMPOSITION

(71) Applicant: SUMITOMO SEIKA CHEMICALS CO., LTD., Hyogo (JP)

(72) Inventors: Kairi Kakutaka, Himeji (JP); Noriaki Fukuda, Osaka (JP); Yuhei Funabiki, Himeji (JP)

(73) Assignee: Sumitomo Seika Chemicals Co., Ltd., Hyogo (JP)

( * ) Notice: Subject to any disclaimer, the term of this patent is extended or adjusted under 35 U.S.C. 154(b) by 99 days.

(21) Appl. No.: 16/646,963

(22) PCT Filed: Sep. 12, 2018

(86) PCT No.: PCT/JP2018/033726
§ 371 (c)(1),
(2) Date: Mar. 12, 2020

(87) PCT Pub. No.: WO2019/054391
PCT Pub. Date: Mar. 21, 2019

(65) Prior Publication Data
US 2020/0208028 A1 Jul. 2, 2020

(30) Foreign Application Priority Data
Sep. 15, 2017 (JP) .............................. JP2017-177800

(51) Int. Cl.
*C08L 63/00* (2006.01)
*C09J 163/00* (2006.01)
*C09J 5/00* (2006.01)

(52) U.S. Cl.
CPC ............. *C09J 163/00* (2013.01); *C08L 63/00* (2013.01); *C09J 5/00* (2013.01); *C08L 2207/04* (2013.01); *C09J 2463/00* (2013.01)

(58) Field of Classification Search
CPC .......................... C08L 63/00–10; C08L 77/12
See application file for complete search history.

(56) References Cited

U.S. PATENT DOCUMENTS

| | | | | |
|---|---|---|---|---|
| 5,409,999 A | * | 4/1995 | Merval | ................ C08L 77/12 525/434 |
| 5,829,557 A | | 11/1998 | Halasy-Wimmer et al. | |
| 6,046,257 A | * | 4/2000 | Oosedo | .................. C08K 9/08 525/61 |
| 2009/0071697 A1 | | 3/2009 | Ishikawa et al. | |
| 2012/0178329 A1 | | 7/2012 | Kochi et al. | |
| 2016/0122528 A1 | | 5/2016 | Kobayashi et al. | |

FOREIGN PATENT DOCUMENTS

| | | |
|---|---|---|
| CN | 1443824 A | 9/2003 |
| JP | H05-148337 A | 6/1993 |
| JP | H10-36532 A | 2/1998 |
| JP | 2005-036095 A | 2/2005 |
| WO | 96/02592 A1 | 2/1996 |
| WO | 2007/052523 A1 | 5/2007 |
| WO | 2011/034040 A1 | 3/2011 |
| WO | 2015/019965 A1 | 2/2015 |

OTHER PUBLICATIONS

English Translation of International Search Report, PCT/JP2018/033726, dated Nov. 13, 2018.
Extended European Search Report in European Patent Application No. EP18856346.4 dated May 14, 2021.

* cited by examiner

*Primary Examiner* — Ana L. Woodward
(74) *Attorney, Agent, or Firm* — Knobbe, Martens, Olson & Bear, LLP

(57) ABSTRACT

There is provided an epoxy resin composition having excellent adhesion to copper and aluminum, and having excellent flexibility in a low-temperature environment. The epoxy resin composition comprises (A) an epoxy resin and (B) a polyamide-based rubber elastomer powder.

9 Claims, No Drawings

EPOXY RESIN COMPOSITION

TECHNICAL FIELD

The present invention relates to an epoxy resin composition.

BACKGROUND ART

In the modern society, many products are made by utilizing various characteristics of organic polymers and assemblies thereof, such as electronic materials, electrical devices, chemical industry, paper, construction materials, paints, pharmaceutical products, cosmetic products, sundry goods, and the like. In these products, a size reduction has been constantly required, and there is a problem of how they can be more compact while having more functionality.

Moreover, along with the technological advances, improved properties have been required in these products to meet the purposes of their use, which has led to technological innovations in the fields of electronics, high-performance paints and pavement materials, automobiles, and the like. In the electronics field, for example, there has been an increasing demand for its representative products, namely, semiconductors, and semiconductors used for thin notebook computers, mobile phones, mobile devices, and the like have been demanded to achieve miniaturization, reduction in weight and thickness, higher-density packaging, and higher integration. For these semiconductors, an adhesive or a composite has been needed that can seal joint portions thinly and locally.

Adhesives are demanded to have a strong adhesion force between different types of materials. There is also a high demand for adhesives for interior materials or adhesives for structures, such as for automobiles, aircraft, or vehicles, and adhesives for structures intended for constructions, such as roofs, walls, or floors. In general, epoxy resins are suitable as such adhesives used for a variety of purposes, and many studies have been made on epoxy resins.

It is known that an epoxy resin, which is a thermosetting resin, forms a random network structure when cured, and provides a cured product that is excellent in properties such as mechanical strength, heat resistance, water resistance, adhesion, electrical insulation properties, and chemical resistance.

However, epoxy resins still have problems in terms of toughness, sufficient adhesion to poorly adhesive substrates, adhesion over a wide range of temperatures, and the like. Various studies have been made to overcome the problems of the epoxy resins.

Patent Literature 1, for example, discloses an adhesive for a structure having excellent adhesion force, which is obtained by blending a carboxyl-terminated nitrile butadiene rubber into an epoxy resin.

Patent Literature 2, for example, discloses an epoxy resin composition that exhibits excellent peel strength, which is obtained by blending 12-nylon particles into an epoxy resin.

CITATION LIST

Patent Literature

Patent Literature 1: JP H5-148337 A
Patent Literature 2: JP 2005-036095 A

SUMMARY OF INVENTION

Technical Problem

While the epoxy resin compositions disclosed in Patent Literatures 1 and 2 exhibit excellent adhesion to iron or steel sheets, they have poor adhesion to aluminum or copper, which is a poorly adhesive substrate, and cannot sufficiently meet the requirement for adhesion between different types of materials demanded by the market.

Moreover, adhesive materials have been used over an increasingly wide range of purposes and regions; however, the epoxy resin composition disclosed in Patent Literature 2 does not have sufficient flexibility in a low-temperature environment, which limits the regions of use.

It is a main object of the present invention to provide an epoxy resin composition having excellent adhesion to copper and aluminum, and having excellent flexibility in a low-temperature environment.

Solution to Problem

The present inventors conducted extensive research to solve the above-described problem. As a result, they found that an epoxy resin composition comprising (A) an epoxy resin and (B) a polyamide-based rubber elastomer powder has excellent adhesion to copper and aluminum, and has excellent flexibility in a low-temperature environment. The present invention was completed as a result of further research based on these findings.

Advantageous Effects of Invention

The present invention can provide an epoxy resin composition having excellent adhesion to copper and aluminum, and having excellent flexibility in a low-temperature environment. The epoxy resin composition of the present invention can be suitably used for purposes for which conventional epoxy resin compositions have been used, such as, for example, an adhesive, a material for a structure, a composite material, a carbon fiber composite material, an adhesive for an electronic material, a semiconductor sealing material, a potting material, a substrate material, a lamination material, a coating material, and a paint. In particular, the epoxy resin composition of the present invention can be suitably used as an adhesive suitable for joining an aluminum member or a copper member to another member (such as a member composed of aluminum, copper, iron, stainless steel, or the like).

DESCRIPTION OF EMBODIMENTS

An epoxy resin composition of the present invention comprises an epoxy resin and a polyamide-based rubber elastomer powder. The epoxy resin composition of the present invention will be hereinafter described in detail. The epoxy resin is denoted herein as the "epoxy resin (A)", and the polyamide-based rubber elastomer powder is denoted herein as the "polyamide-based rubber elastomer powder (B)".

As used herein, the term "comprising" includes "consisting essentially of" and "consisting of".

<Epoxy Resin (A)>

The epoxy resin (A) is not specifically limited as long as it is an epoxy resin that has epoxy group(s) and is curable. Examples of the epoxy resin (A) include a monoepoxy compound and a polyvalent epoxy compound. The epoxy resin composition of the present invention may contain a single epoxy resin (A), or two or more epoxy resins (A).

Specific examples of the monoepoxy compound include butyl glycidyl ether, hexyl glycidyl ether, phenyl glycidyl ether, allyl glycidyl ether, p-butylphenyl glycidyl ether, p-xylyl glycidyl ether, glycidyl acetate, glycidyl butyrate, glycidyl hexoate, and glycidyl benzoate.

Examples of the polyvalent epoxy compound include a bisphenol-type epoxy resin, an epoxy resin obtained by glycidylating a polyhydric phenol compound, a novolac-type epoxy resin, an aliphatic ether-type epoxy resin, an ether ester-type epoxy resin, an ester-type epoxy resin, an amine-type epoxy resin, and a cycloaliphatic epoxy resin.

Specific examples of the bisphenol-type epoxy resin include an epoxy resin obtained by glycidylating a bisphenol, such as bisphenol A, bisphenol F, bisphenol AD, bisphenol S, tetramethylbisphenol A, tetramethylbisphenol F, tetramethylbisphenol AD, tetramethylbisphenol S, tetrabromobisphenol A, tetrachlorobisphenol A, or tetratluorobisphenol A.

Specific examples of the epoxy resin obtained by glycidylating a polyhydric phenol compound include an epoxy resin obtained by glycidylating a dihydric phenol compound, such as biphenol, dihydroxynaphthalene, or 9,9-bis(4-hydroxyphenyl)fluorene; an epoxy resin obtained by glycidylating a trisphenol compound, such as 1,1,1-tris(4-hydroxyphenyl)methane; and an epoxy resin obtained by glycidylating a tetrakisphenol compound, such as 1,1,2-tetrakis(4-hydroxyphenyl)ethane.

Specific examples of the novolac-type epoxy resin include an epoxy resin obtained by glycidylating a novolac compound, such as a phenol novolac-type, cresol novolac-type, bisphenol A novolac-type, brominated phenol novolac-type, or brominated bisphenol A novolac-type novolac compound.

Specific examples of the aliphatic ether-type epoxy resin include an epoxy resin obtained by glycidylating a polyhydric alcohol, such as glycerin or polyethylene glycol.

Specific examples of the ether ester-type epoxy resin include an epoxy resin obtained by glycidylating a hydroxycarboxylic acid, such as p-hydroxybenzoic acid.

Specific examples of the ester-type epoxy resin include an epoxy resin obtained by glycidylating a polycarboxylic acid, such as phthalic acid or terephthalic acid.

Specific examples of the amine-type epoxy resin include an epoxy resin obtained by glycidylating an amine compound, such as 4,4'-diaminodiphenylmethane or m-aminophenol.

Specific examples of the cycloaliphatic epoxy resin include 3,4-epoxycyclohexylmethyl-3',4)-epoxycyclohexane carboxylate, 1,2-epoxy-4-vinylcyclohexane, bis(3,4-epoxycyclohexylmethyl)adipate, 1-epoxyethyl-3,4-epoxycyclohexane, limonen diepoxide, and 3,4-epoxycyclohexylmethanol.

Among the epoxy resins (A), the bisphenol-type epoxy resin is preferred; in particular, a bisphenol A-type epoxy resin or a bisphenol F-type epoxy resin, for example, is suitably used.

<Polyamide-Based Rubber Elastomer Powder (B)>

In the present invention, the polyamide-based rubber elastomer powder (B) is composed of the powder of a polyamide-based rubber elastomer. The polyamide-based rubber elastomer is an elastomer composed of polyamide-based rubber. Preferably, the polyamide-based rubber elastomer exhibits the property of having rubber elasticity at room temperature, and becoming plastic at a high temperature (property similar to that of a thermoplastic resin).

While the polyamide-based rubber elastomer is not specifically limited in structure, it preferably has a polymer structure. More specifically, the polyamide-based rubber elastomer is preferably composed of a soft polymer structure, or composed of a combined structure of a hard polymer segment and a soft polymer segment.

The polyamide-based rubber elastomer powder (B) preferably has an amide unit and an ether unit. Specifically, the polyamide-based rubber elastomer powder (B) preferably includes a structure represented by the following formula (1):

-[(A)-(X)-(E)]- (1)

in the general formula (1), (A) denotes an amide unit; (E) denotes an ether unit; and (X) denotes a linking group that binds the amide unit and the ether unit.

Each of the amide unit and the ether unit may be a monomer unit or a polymer unit. When the amide unit is a polymer unit, (A) constitutes a polyamide block. When the ether unit is a polymer unit, (B) constitutes a polyether block.

The polyamide-based rubber elastomer powder (B) may include a single structure, or two or more structures represented by the general formula (1). For example, the polyamide-based rubber elastomer powder (B) may be composed of a block copolymer in which the polyamide block and the polyether block are bound with the linking group, or may be composed of a copolymer in which structure(s) (single structure, or two or more structures) represented by the general formula (1) are bound.

As described below, in the polyamide-based rubber elastomer powder (B), the polyamide block tends to constitute the hard polymer segment, and the polyether block tends to constitute the soft polymer segment.

The polyamide-based rubber elastomer powder (B) is preferably a block copolymer having a structure of the general formula (1) wherein (A) is a polyamide block; (E) is a polyether block; and (A) and (E) are bound with the linking group. While not wishing to be construed in any restricted manner, it is believed that with this structure, the polyamide block constituting the hard polymer segment and the polyether block constituting the soft polymer segment can function favorably to provide the epoxy resin composition of the present invention with excellent flexibility in a low-temperature environment and excellent adhesion to copper and aluminum.

Examples of the monomer constituting the amide unit include a lactam compound, an aminocarboxylic acid compound, and a salt of a diamine compound and a dicarboxylic acid compound. As the monomer constituting the amide unit, a single monomer, or two or more monomers may be used.

Examples of the lactam compound include caprolactam, capryllactam, enantholactam, and lauryllactam. A cyclic lactam can also be preferably used as the lactam compound, and examples of the cyclic lactam include ε-caprolactam, ω-enantholactam, and ω-lauryllactam.

Examples of the aminocarboxylic acid compound include ω-aminocaproic acid, ω-aminoenanthic acid, ω-aminocaprylic acid, ω-aminopelargonic acid, ω-aminocapric acid, 6-aminocaproic acid, 7-aminoheptanoic acid, 9-aminononanoic acid, 11-aminoundecanoic acid, and 12-aminododecanoic acid.

Examples of the diamine compound in the salt of the diamine compound and the dicarboxylic acid compound include ethylenediamine, triethylenediamine, tetraethylenediamine, pentamethylenediamine, hexamethylenediamine, 1,7-diaminoheptane, 1,8-diaminooctane, 1,9-diaminononane, 1,10-diaminodecane, phenylenediamine, and m-xylylenediamine. Examples of the dicarboxylic acid compound include oxalic acid, succinic acid, glutaric acid, adipic acid, pimelic acid, sebacic acid, terephthalic acid, isophthalic acid, suberic acid, azelaic acid, nonanedicarboxylic acid, decanedicarboxylic acid, tetradecanedicarboxylic acid, octadecanedicarboxylic acid, fumaric acid, phthalic acid, xylylene dicarboxylic acid, and a dimer acid (an unsaturated dicarboxylic acid containing 36 carbon atoms, synthesized from an unsaturated fatty acid including linoleic acid or oleic acid as a main component). The salt of the diamine compound and the dicarboxylic acid compound is preferably a salt of a diamine compound and a dicarboxylic acid compound, and more preferably a salt of one selected from the group consisting of ethylenediamine, triethylenediamine, tetramethylenediamine, and hexamethylenediamine and one selected from the group consisting of oxalic acid, succinic acid, glutaric acid, adipic acid, pimelic acid, sebacic acid, terephthalic acid, and isophthalic acid.

Examples of the monomer constituting the ether unit include a glycol compound. The ether unit may be a diamine compound having a polyether chain, for example.

Examples of the glycol compound include polyethylene oxide glycol, polypropylene oxide glycol, polytetramethylene oxide glycol, and polyhexamethylene oxide glycol. Examples of the diamine compound having a polyether chain include polyether diamine.

The structure of the linking group ((X) in the general formula (1)) that binds the amide unit and the ether unit is —CO—NH— or —CO—O—, for example, and is preferably —CO—NH—.

In the polyamide-based rubber elastomer powder (B), the copolymer in which the linking group has the structure "—CO—NH—" is referred to as a polyether block amide copolymer, and the copolymer in which the linking group has the structure "—CO—O—" is referred to as a polyether ester block amide copolymer. Specifically, when these copolymers are expressed using the general formula (1), examples of the block copolymer in which the polyamide block and the polyether block are bound via the linking group (E) include the polyether block amide copolymer represented by the following general formula (11) and the polyether ester block amide copolymer represented by the following general formula (12):

-[(A)-(CO—NH)-(E)]-         (11)

-[(A)-(CO—O)-(E)]-         (12)

In the general formulae (11) and (12), (A) denotes a polyamide block; and (E) denotes a polyether block.

While not wishing to be construed in any restricted manner, it is believed that when the polyimide-based rubber elastomer powder (B) is a block copolymer including the polyamide block and the polyether block, it has a combined structure of a hard polymer segment (also referred to as a hard segment) having the polyamide block and a soft polymer segment (also referred to as a soft segment) having the polyether block. It is believed that the hard polymer segment is crystalline and has a high melting point and the soft polymer segment is amorphous and has a low glass transition temperature. It is believed that because of these properties, the polyamide block constituting the hard polymer segment and the polyether block constituting the soft polymer segment can function favorably to provide the epoxy resin composition of the present invention with excellent flexibility in a low-temperature environment and excellent adhesion to copper and aluminum.

In the present invention, particularly the polyether block amide copolymer (general formula (11)) can be suitably used as the polyamide-based rubber elastomer, from the viewpoint of readily obtaining an aqueous dispersion of the polyamide-based rubber elastomer having excellent hydrolysis resistance and heat resistance, and exhibiting an excellent particle size distribution without the use of an organic solvent.

In the epoxy resin composition of the present invention, the polyamide-based rubber elastomer powder (B) is preferably contained in an amount of 1 to 50 parts by mass, more preferably 3 to 40 parts by mass, and still more preferably 3 to 30 parts by mass, per 100 parts by mass of the epoxy resin (A), from the viewpoint of obtaining an epoxy resin composition having excellent adhesion to copper and aluminum, and having excellent flexibility in a low-temperature environment.

The polyamide-based rubber elastomer powder (B) may be a known substance, or may be a product produced using a known method it may also be a commercial product.

Examples of the method for producing the polyamide-based rubber elastomer constituting the polyamide-based rubber elastomer powder (B) include a method in which a dicarboxylic acid is reacted with at least one selected from the group consisting of a lactam compound, an aminocarboxylic acid compound, and a salt of a diamine compound and a dicarboxylic acid compound to prepare a polyamide block substantially having carboxyl groups at both ends, and then at least one selected from the group consisting of a glycol compound and a diamine compound is added to the polyamide block, and reacted by heating.

The dicarboxylic acid used in this method may, for example, be the same as the dicarboxylic acid compound exemplified in the description of "the salt of the diamine compound and the dicarboxylic acid compound" above.

When the polyamide-based rubber elastomer is a commercial product, examples of the commercial product include a polyether block amide copolymer (trade name "UBESTA XPA") manufactured by Ube Industries, Ltd.; a polyether ester block amide copolymer (trade name "Pebax") manufactured by Arkema Inc.; a polyether block amide copolymer (trade name "DAIAMID") manufactured by Daicel-Evonik Ltd.; a polyether block amide copolymer (trade name "Grilamid") manufactured by EMS-CHEMIE Japan, Ltd.; a polyether block amide copolymer (trade name "Hyper-Alloy Actymer") manufactured by Riken Technos Corporation; and a polyether block amide copolymer (trade name "Novamid") manufactured by Mitsubishi Engineering-Plastics Corporation.

While the volume average particle diameter of the polyamide-based rubber elastomer powder (B) is not specifically limited, it is preferably 1 to 25 μm, more preferably 1.5 to 20 μm, still more preferably 3 to 15 μm, and particularly preferably 5 to 15 μm. When the volume average particle diameter is 25 μm or less, a cured product of the epoxy resin composition can have suitable adhesion. When the volume average particle diameter is 1 μm or more, the epoxy resin composition can have an appropriate viscosity, and the polyamide-based rubber elastomer powder (B) can be suitably dispersed in the epoxy resin composition of the present invention.

The volume average particle diameter of the polyamide-based rubber elastomer powder (B) represents the value determined using the electrical sensing zone method (pore electrical resistance method).

Specific examples of the apparatus for measuring the volume average particle diameter using the pore electrical resistance method include an electrical sensing-type particle size distribution measurement apparatus (trade name "Coulter Multisizer" manufactured by Beckman Coulter, Inc.). There are various sizes for the aperture diameter to be used in the measurement, and each aperture diameter has an analytical range (sizes of volume average particle diameters) suitable for the measurement. The aperture diameter can be selected to cover particle diameters included in the particles to be measured. In the Examples described below, an aperture diameter of 100 μm was used based on this principle. An aperture diameter smaller than 100 μm may be selected to measure particles including particle diameters smaller than the analytical range for which the aperture diameter of 100 μm is suitable; and an aperture diameter greater than 100 μm may be selected to measure particles including particle diameters greater than the analytical range for which the aperture diameter of 100 μm is suitable.

While the melting point of the polyamide-based rubber elastomer powder (B) is not specifically limited, the lower limit of the melting point is preferably 100° C. or higher, more preferably 110° C. or higher, still more preferably 120° C. or higher, and particularly preferably 130° C. or higher. The upper limit of the melting point is preferably lower than 180° C., more preferably lower than 170° C., still more preferably lower than 160° C., and particularly preferably lower than 150° C.

The melting point of the polyamide-based rubber elastomer powder (B) represents the value determined using a differential scanning calorimeter (DSC).

While the flexural modulus of the polyamide-based rubber elastomer constituting the polyamide-based rubber elastomer powder (B) is not specifically limited, the flexural modulus measured using the method in accordance with JIS K7171 is preferably 900 MPa or less (for example, about 10 to 850 MPa), more preferably 600 MPa or less (for example, about 25 to 550 MPa), and particularly preferably 450 MPa or less (for example, about 55 to 400 MPa).

The polyamide-based rubber elastomer powder (B) preferably has a 10% displacement compression strength of 0.1 to 4.5 MPa, and more preferably 0.5 to 3 MPa.

As used herein, the 10% displacement compression strength refers to the value calculated as follows: when a compression test is performed on the resin particles using the micro-compression tester MCT-W500 manufactured by Shimadzu Corporation, the value is calculated from the particle diameter and the load at the time of a 10% deformation relative to the particle diameter, based on the equation [compression strength (MPa)=2.8×load (N) at the time of a 10% deformation/{π×particle diameter (mm)×particle diameter (mm)}].

The polyamide-based rubber elastomer powder (B) is preferably spherical. The average degree of circularity of the polyamide-based rubber elastomer powder (B) is preferably 70 to 100, and more preferably 80 to 100.

As described below, the average degree of circularity of the polyamide-based rubber elastomer powder (B) represents the value measured using an image analysis-type particle size distribution analyzer.

The method for producing the polyamide-based rubber elastomer powder (B) may specifically be, for example, the following method:

Initially, the polyamide-based rubber elastomer, an ethylene oxide/propylene oxide copolymer, and an aqueous medium are placed in a container to prepare a mixture of these components.

In this case, in order to obtain the polyamide-based rubber elastomer powder (B) having a highly uniform particle size distribution with high productivity, it is preferred to use a surfactant other than the ethylene oxide/propylene oxide copolymer, as required, in addition to the ethylene oxide/propylene oxide copolymer.

The surfactant other than the ethylene oxide/propylene oxide copolymer may be a nonionic surfactant.

Examples of the nonionic surfactant include polyethylene glycol, polyvinyl alcohol, polyoxyethylene alkyl ethers, polyoxyethylene alkyl phenyl ethers, polyoxyethylene alkyl thioethers, acetylene glycol, polyoxyethylene fatty acid esters, polyoxyethylene sorbitan fatty acid esters, polyoxyethylene alkyl amides, alkyl fatty acid diethanolamides, and glycerin fatty acid esters.

In the present invention, a nonionic surfactant is suitably used from the viewpoint of readily obtaining the polyamide-based rubber elastomer powder (B) having a highly uniform particle size distribution; in particular, a nonionic surfactant having an ether bond is suitably used.

Among the above-mentioned surfactants, those that correspond to the nonionic surfactant having an ether bond are polyethylene glycol, polyoxyethylene alkyl ethers, polyoxyethylene alkyl phenyl ethers, polyoxyethylene alkyl thioethers, polyoxyethylene fatty acid esters, polyoxyethylene sorbitan fatty acid esters, sorbitan fatty acid esters, and polyoxyethylene alkyl amides. Among the above, polyethylene glycol, polyoxyethylene fatty acid esters, and sorbitan fatty acid esters are particularly preferred.

The "alkyl" in the polyoxyethylene alkyl ethers, polyoxyethylene alkyl phenyl ethers, polyoxyethylene alkyl thioethers, or polyoxyethylene alkyl amides is preferably a $C_{10-18}$ alkyl; more specifically, preferred examples include capryl, lauryl, myristyl, palmityl, and stearyl. The "fatty acid" in the polyoxyethylene fatty acid esters, polyoxyethylene sorbitan fatty acid esters, or sorbitan fatty acid esters is preferably a $C_{10-18}$ fatty acid; more specifically, preferred examples include capric acid, lauric acid, myristic acid, palmitic acid, stearic acid, oleic acid, and linoleic acid. Among the sorbitan fatty acid esters, sorbitan monolaurate is particularly preferred.

As the surfactant other than the ethylene oxide/propylene oxide copolymer, a single surfactant may be used, or two or more surfactants may be used in combination. When two or more surfactants are used in combination, it is preferred to use two or more of the nonionic surfactants in combination, and it is more preferred to use two or more of the nonionic surfactants having an ether bond in combination.

The amount of the surfactant including the ethylene oxide/propylene oxide copolymer (specifically, when the surfactant other than the ethylene oxide/propylene oxide copolymer is not used, the surfactant means the ethylene oxide/propylene oxide copolymer, and when the surfactant other than the ethylene oxide/propylene oxide copolymer is used, the surfactant means the surfactant and the ethylene oxide/propylene oxide copolymer; the same applies below) to be used is preferably less than 20 parts by mass, and more preferably 1 to 12 parts by mass, per 100 parts by mass of the polyamide-based rubber elastomer. The use of the surfactant including the ethylene oxide/propylene oxide copolymer in an amount of less than 20 parts by mass is desirable in that the surfactant including the ethylene oxide/propylene oxide copolymer is readily removed in the step of removing the aqueous medium described below. In the method for producing the polyamide-based rubber elastomer powder (B), it is desirable that the surfactant including the ethylene oxide/propylene oxide copolymer be dissolved in the aqueous medium and removed as much as possible, in the step of removing the aqueous medium, although the method is not specifically limited thereto. For example, if the surfactant remains, the purposes of use of the epoxy resin composition may become limited. Moreover, if the surfactant has not been removed from the spherical powder, in some cases where the polyamide-based rubber elastomer powder absorbs moisture, depending on the storage condition, the surfactant on the powder surface may be eluted due to the moisture, which makes the surface sticky and uncomfortable to the touch, and also reduces the flowability of the powder, which makes the powder difficult to handle.

In the production of the polyamide-based rubber elastomer powder (B), an antioxidant may be optionally used. The use of an antioxidant can prevent thermal degradation or discoloration of the resulting polyamide-based rubber elastomer powder (B) to improve the durability. The antioxidant to be used may be blended into the above-mentioned mixture.

While the antioxidant is not specifically limited in type, it may be a hindered phenol antioxidant, a sulfur-based antioxidant, a phosphorus-based antioxidant, an amine-based antioxidant, or the like.

The hindered phenol antioxidant may be a known hindered phenol antioxidant, and representative examples include triethylene glycol-bis[3-(3-t-butyl-5-methyl-4-hydroxyphenyl)propionate], 1,6-hexanediol-bis-[3-(3,5-di-t-butyl4-hydroxyphenyl)propionate], N,N'-hexamethylenebis(3,5-di-t-butyl-4-hydroxy-hydrocinnamide), pentaerythrityl-tetrakis[3-(3,5-di-t-butyl-4-hydroxyphenyl) propionate], octadecyl-3-(3,5-di-t-butyl-4-hydroxyphenyl) propionate, 1,3,5-trimethyl-2,4,6-tris(3,5-di-t-butyl-4-hydroxybenzyl)benzene, ethyl phenol, 2,2'-methylenebis(4-methyl-6-t-butylphenol), 4,4'-thio-bis(3-methyl-6-t-butylphenol), 4,4'-butylidene-bis(3-methyl-6-t-butylphenol), 1,1,3-tris(2-methyl-4-hydroxy-5-t-butylphenyl)butane, 1,3,5-tris(4-hydroxybenzyl)benzene, and tetrakis[methylene-3-(3,5'-di-t-butyl-4'-hydroxyphenyl propionate)]methane. One, or two or more of the above may be used. In particular, 1,6-hexanediol-bis-[3-(3,5-di-t-butyl-4-hydroxyphenyl)propionate], pentaerythrityl-tetrakis[3-(3, 5-di-t-butyl-4-hydroxyphenyl)propionate], N,N-hexamethylenebis(3,5-di-t-butyl-4-hydroxy-hydrocinnamide), and 1,3,5-trimethyl-2,4,6-tris(3,5-di-t-butyl-4-hydroxybenzyl) benzene are preferred.

Examples of the sulfur-based antioxidant include dilauryl thiodipropionate, dimyristyl thiodipropionate, distearyl thiodipropionate, and pentaerythritol-tetrakis(β-laurylthio propionate). In particular, pentaerythritol-tetrakis(β-laurylthio propionate) is preferred.

Examples of the phosphorus-based antioxidant include tris(2,4-di-t-butylphenyl)phosphite, bis[2,4-bis(1,1-dimethylethyl)-6-methylphenyl]ethyl ester of phosphorous acid, tetrakis(2,4-di-t-butylphenyl)[1,1-biphenyl]-4,4-diyl bisphosphonite, bis(2,4-di-t-butylphenyl)pentaerythritol-di-phosphite, bis(2,6-di-t-butyl-4-methylphenyl)pentaerythritol-di-phosphite, and bis(2,4-dicumylphenyl)pentaerythritol-di-phosphite.

Examples of the amine-based antioxidant include octylated diphenylamine, 2,4-bis-(n-octylthio)-6-(4-hydroxy-3, 5-di-t-butylanilino)-1,3,5-triazine, phenyl-1-naphthylamine, poly(2,2,4-trimethyl-1,2-dihydroquinoline), and N,N'-diphenyl-p-phenylenediamine.

Two or more of these antioxidants may be used in combination. The use of these antioxidants in combination can improve the heat resistance of the polyamide-based rubber elastomer powder (B).

The amount of the antioxidant to be used is preferably 0.01 to 10 parts by mass, more preferably 0.05 to 8 parts by mass, and particularly preferably 0.1 to 5 parts by mass, per 100 parts by mass of the polyamide-based rubber elastomer. The use of the antioxidant in an amount of less than 10 parts by mass is economically preferred, and also reduces the possibility that the antioxidant may readily bleed, which makes the surface of the product cloudy, for example, resulting in a damaged appearance. The use of the antioxidant in an amount above 0.01 part by mass is preferred to achieve good heat resistance of the polyamide-based rubber elastomer powder (B), and, by extension, the epoxy resin composition.

The container to be used for preparing the above-mentioned mixture is preferably a pressure-resistant container equipped with a heating means for heating the mixture to a temperature equal to or higher than the temperature at which the polyamide-based rubber elastomer softens in the aqueous medium, and a stirring means capable of applying a shear force to the contents. For example, the container is preferably a pressure-resistant autoclave equipped with a stirrer.

Subsequently, the above-mentioned mixture is heated to a temperature equal to or higher than the softening temperature of the polyamide-based rubber elastomer, and stirred. The resulting emulsion is then cooled to room temperature, thereby obtaining an aqueous dispersion of the polyamide-based rubber elastomer.

The polyamide-based rubber elastomer powder (B) can be produced by removing the aqueous medium from the aqueous dispersion of the polyamide-based rubber elastomer.

Examples of the method for removing the aqueous medium from the aqueous dispersion of the polyimide-based rubber elastomer include, but are not specifically limited to, a method in which the aqueous medium is evaporated from the aqueous dispersion of the polyamide-based rubber elastomer to obtain the polyamide-based rubber elastomer powder (B); a method in which the aqueous dispersion of the polyamide-based rubber elastomer is filtered through a filtering material (preferably a filtering material having porous properties, for example) to filter off the aqueous medium from the aqueous dispersion; and a method in which the aqueous dispersion is centrifuged or decanted to precipitate the polyamide-based rubber elastomer, and then the aqueous medium is removed.

The method for filtering off the aqueous medium from the aqueous dispersion of the polyamide-based rubber elastomer is not specifically limited.

While the filtration may be performed using any method such as normal-pressure filtration, reduced-pressure filtration, pressure filtration, or hot filtration, filtration by reduced-pressure filtration or by pressure filtration can be suitably used, because the aqueous dispersion of the polyamide-based rubber elastomer readily gives a good wet cake, and the method of filtering off the aqueous medium has high productivity.

The method for drying the wet cake is not specifically limited, and may be a known drying method. For example, the wet cake may be dried with a dryer. The apparatus for drying the wet cake is not specifically limited, and may be a conventional apparatus such as a hot-air dryer or a reduced-pressure dryer. The drying temperature and the pressure conditions, such as under normal pressure or reduced pressure, for drying the wet cake, are not specifically limited; however, the drying temperature is preferably about 50 to 150° C., and more preferably 70 to 100° C. A drying temperature of 50° C. or higher is preferred in terms of production efficiency in that the aqueous medium can be removed by drying in a shorter period of time. A drying temperature of 150° C. or lower is preferred in that the wet cake can be dried while further inhibiting thermal degradation of the polyamide-based rubber elastomer powder (B).

The polyamide-based rubber elastomer powder (B) has hygroscopicity and thus, when left in the air, it has the property of experiencing a gradual increase in the moisture content. Preferably, therefore, the polyamide-based rubber elastomer powder (B) after drying is rapidly transferred into a hermetically sealed container, such as a desiccator, to block the air.

The shape of the polyamide-based rubber elastomer powder (B) produced by the above-described method is spherical. This can be confirmed with an electron microscope, for example. In the present invention, "spherical" may include a sphere that is allowed to have a distortion of about 10% relative to a perfect sphere.

Regarding the shape of the polyamide-based rubber elastomer powder (B), the average degree of circularity is measured using an image analysis-type particle size distribution measurement apparatus (for example, Microtrac PartAn SI manufactured by MicrotracBEL Corporation). The average degree of circularity represents the value obtained by summing all the values of the degree of circularity of projected images detected in a measurable range of particle diameters, and dividing the sum value by the number of the detected projected images. As used herein, the projected images refers to the images of particles detected (projected) as images by the apparatus. The degree of circularity refers to a representative index (equivalent circle diameter/perimeter diameter) that indicates how close to a circle the projected image is. The equivalent circle diameter refers to the diameter of a circle having the same area as that of the particle projected image. The perimeter diameter refers to the diameter of a circle having the same perimeter as that of the projected image.

To further improve the powder properties, the polyamide-based rubber elastomer powder (B) may be a polyamide-based rubber elastomer powder having improved flowability, which is obtained by adding an inorganic micropowder of silica, alumina, or the like as a lubricant.

<Curing Agent that may be Contained in Epoxy Resin Composition>

The epoxy resin composition of the present invention may further contain a curing agent, in addition to the epoxy resin (A) and the polyamide-based rubber elastomer powder (B). The curing agent is not specifically limited as long as it can react with the epoxy resin (A) to give a cured product. A single curing agent may be used, or two or more curing agents may be used as a mixture.

Examples of the curing agent include an amine-based curing agent, an amide-based curing agent, an acid anhydride-based curing agent, a phenol-based curing agent, a mercaptan-based curing agent, an isocyanate-based curing agent, an active ester-based curing agent, and a cyanate ester-based curing agent.

Examples of the amine-based curing agent include chain aliphatic amines, such as ethylenediamine, diethylenetriamine, triethylenetetramine, and tetraethylenepentamine, cycloaliphatic amines, such as isophoronediamine, benzenediamine, bis(4-aminocyclohexyl)methane, bis(aminomethyl)cyclohexane, and diaminodicyclohexylmethane; aromatic amines, such as metaphenylenediamine, diaminodiphenylmethane, diethyltoluenediamine, and diaminodiethyldiphenylmethane; and secondary and tertiary amines, such as benzyldimethylamine, triethylenediamine, piperidine, 2-(dimethylaminomethyl)phenol, 2,4,6-tris(dimethylaminomethyl)phenol, DBU (1,8-diazabicyclo(5,4,0)-undecene-7), and DBN (1,5-diazabicyclo(4,3,0)-nonene-5).

Examples of the amide-based curing agent include dicyandiamide and derivatives thereof, and polyamide resins (such as polyaminoamide).

Examples of the acid anhydride-based curing agent include aliphatic acid anhydrides, such as maleic anhydride and dodecenylsuccinic anhydride; aromatic acid anhydrides, such as phthalic anhydride, trimellitic anhydride, and pyromellitic dianhydride; and cycloaliphatic acid anhydrides, such as methylnadic anhydride, tetrahydrophthlic anhydride, methyltetrahydrophthalic anhydride, hexahydrophthalic anhydride, and 4-methylhexahydrophthahic anhydride.

Examples of the phenol-based curing agent include a phenol novolac resin, a cresol novolac resin, a biphenyl-type novolac resin, a triphenylmethane-type phenol resin, a naphthol novolac resin, a phenol biphenylene resin, a phenol aralkyl resin, a biphenylaralkyl-type phenol resin, a modified polyphenylene ether resin, and a compound having a benzoxazine ring.

Examples of the mercaptan-based curing agent include trimethylolpropane tris(3-mercaptopropionate), tris-[(3-mercaptopropionyloxy)-ethyl]-isocyanurate, pentaerythritol tetrakis(3-mercaptopropionate), tetraethyleneglycol bis(3-mercaptopropionate), pentaerythritol tetrakis(3-mercaptobutyrate), 1,4-bis(3-mercaptobutyryloxy)butane, trimethylolpropane tris(3-mercaptobutyrate), trimethylolethane tris(3-mercaptobutyrate), and a polysulfide polymer.

Examples of the isocyanate-based curing agent include hexamethylene diisocyanate, 1,4-tetramethylene diisocyanate, 2-methylpentane-1,5-diisocyanate, lysine diisocyanate, isophorone diisocyanate, and norbornane diisocyanate.

Examples of the active ester-based curing agent include compounds having, per molecule, one or more ester groups reactive with epoxy resins, for example, a phenol ester, a thiophenol ester, an N-hydroxyamine ester, and a heterocyclic hydroxy compound ester.

Examples of the cyanate ester-based curing agent include a novolac-type cyanate resin, and bisphenol-type cyanate resins, such as a bisphenol A-type cyanate resin, a bisphenol E-type cyanate resin, and a tetramethylbisphenol F-type cyanate resin.

The amount of the curing agent to be contained in the epoxy resin composition of the present invention is not specifically limited. For example, the curing agent is preferably contained in an amount such that 0.1 to 5 equivalents of reactive functional groups in the curing agent are present per equivalent of epoxy groups in the entire epoxy resin (epoxy resin (A)). The reactive functional groups in the curing agent are more preferably present in an amount of 0.3 to 3 equivalents, and still more preferably 0.5 to 2 equivalents.

<Curing Accelerator that may be Contained in Epoxy Resin Composition>

The epoxy resin composition of the present invention may further contain a curing accelerator, in addition to the epoxy resin (A) and the polyamide-based rubber elastomer powder (B). When the curing accelerator is used in combination with the curing agent, it can increase the curing reaction rate, or increase the strength of the resulting cured product, for example. The curing accelerator can accelerate curing of the epoxy resin, even if it is not used in combination with the curing agent. The curing accelerator is not specifically limited as long as it can react with the epoxy resin to give a cured product. A single curing accelerator may be used, or two or more curing accelerators may be used as a mixture.

Examples of the curing accelerator include imidazole and imidazole compounds, such as 2-methylimidazole, 2-ethylimidazole, 2-ethyl-4-methylimidazole, and 2-phenylimidazole; dicyandiamide and derivatives thereof; tertiary amines, such as DBU (1,8-diazabicyclo(5,4,0)-undecene-7), DBN (1,5-diazabicyclo(4,3,0)-nonene-5), and 2,4,6-tris(dimethylaminomethyl)phenol; a phosphorus-based compound, a Lewis acid compound, and a cationic polymerization initiator.

In the epoxy resin composition of the present invention, at least one curing agent selected from the group consisting of an amine-based curing agent, an acid anhydride-based curing agent, and a phenol-based curing agent may be used, and at least one curing accelerator selected from the group consisting of imidazole, dicyandiamide, a phosphorus-based compound, and a cationic polymerization initiator may be used.

In the epoxy resin composition of the present invention, the amount of the curing accelerator to be contained is not specifically limited. For example, the curing accelerator is preferably contained in an amount of 0.01 to 10 parts by mass per 100 parts by mass of the epoxy resin (A). The curing accelerator is more preferably contained in an amount of 0.1 to 5 parts by mass, and still more preferably 0.5 to 3 parts by mass, per 100 parts by mass of the epoxy resin (A).

<Additives that may be Contained in Epoxy Resin Composition>

The epoxy resin composition of the present invention may optionally contain other additives, as long as they do not impair the object or effects of the present invention.

Examples of the additives include antioxidants, inorganic fluorescent substances, lubricants, ultraviolet absorbers, heat/light stabilizers, antistatic agents, polymerization inhibitors, anti-foaming agents, solvents, anti-aging agents, radical inhibitors, adhesion-improving agents, flame retardants, surfactants, storage stability-improving agents, ozone aging inhibitors, thickeners, plasticizers, radiation-blocking agents, nucleating agents, coupling agents, conductivity-imparting agents, phosphorus-based peroxide-decomposing agents, pigments, metal deactivators, and physical property-controlling agents.

<Method for Producing Epoxy Resin Composition>

The epoxy resin composition of the present invention can be produced by mixing the epoxy resin (A), the polyamide-based rubber elastomer powder (B), and optionally a curing agent, a curing accelerator, and other additives.

The mixing method is not specifically limited as long as it can homogeneously mix the components, and examples include mixing and stirring with a paddle blade; mixing and stirring with a homomixer; and mixing and stirring with a planetary centrifugal mixer.

Because the epoxy resin composition of the present invention has a low viscosity, it can be prepared without adding a solvent. Optionally, however, a solvent (such as toluene, xylene, methyl ethyl ketone, acetone, cyclohexanone, methylcyclohexane, or cyclohexane) may be added to the epoxy resin composition, as long as it does not adversely affect the effects of the present invention.

A cured product can be obtained by curing the epoxy resin composition of the present invention. The curing method is not specifically limited; for example, the composition can be cured by heating. The curing temperature is typically from room temperature (25° C.) to 250° C. The curing time, which may vary depending on the liquid composition, may be set in a wide range that is typically from 30 minutes to 1 week.

The epoxy resin composition of the present invention can be suitably used for purposes such as an adhesive, a material for a structure, a composite material, a carbon fiber composite material, an adhesive for an electronic material, a semiconductor sealing material, a potting material, a substrate material, a lamination material, a coating material, and a paint. The epoxy resin composition of the present invention can be suitably used as an adhesive suitable for joining an aluminum member or a copper member to another member (such as a member composed of aluminum, copper, iron, stainless steel, or the like).

<Cured Product of Epoxy Resin Composition>

A cured product of the epoxy resin composition of the present invention is obtained by curing the epoxy resin composition of the present invention described above. While the method for curing the epoxy resin composition of the present invention is not specifically limited, examples include a method in which the epoxy resin composition of the present invention is heated, as described above.

The cured product of the epoxy resin composition of the present invention preferably has a storage modulus at −30° C. of less than 2.0 GPa, and more preferably in the range of 1.0 to 1.8 GPa, as measured using the following method.

<Measurement of Storage Modulus at −30° C.>

The epoxy resin composition is poured into a resin mold, and cured by heating at 80° C. for 1 hour, at 100° C. for 1 hour, and at 150° C. for 2 hours, to prepare a test sample for dynamic viscoelasticity measurement. The storage modulus at −30° C. is measured under the following measurement conditions: tensile mode, a frequency of 1 Hz, −50 to 300° C., and a heating rate of 10° C./min. A TPX mold is denoted as the resin mold.

EXAMPLES

The present invention will be hereinafter described in detail by way of examples and comparative examples, although the present invention is not limited thereto.

[Production Example of Polyamide-Based Rubber Elastomer Powder]

In a pressure-resistant autoclave with an internal volume of 1 liter, equipped with a turbine-type stirring blade with a diameter of 50 mm, 160 g of a polyether block amide copolymer (melting point: 135° C., flexural modulus: 89 MPa) as a polyamide-based rubber elastomer, 22.4 g of deionized water, and 16 g of an ethylene oxide/propylene oxide copolymer (weight average molecular weight: 15,500, ethylene oxide content: 80% by weight) were placed, and the autoclave was hermetically sealed. Subsequently, the temperature inside the autoclave was increased to 180° C. with stirring. Stirring was further continued while maintaining the inside temperature at 180° C., and then the contents were cooled to room temperature to obtain an aqueous dispersion of the polyamide-based rubber elastomer. Subsequently, the aqueous medium was filtered off from the aqueous dispersion.

Subsequently, the wet cake was put in a reduced-pressure dryer and dried under reduced pressure, and then removed to obtain a polyamide-based rubber elastomer powder. The polyimide-based rubber elastomer powder thus obtained exhibited a volume average particle diameter of 10.5 μm, as measured by the electrical sensing zone method using the aperture 100. A portion of the polyamide-based rubber elastomer powder was extracted and observed with a scanning electron microscope (JSM-6390LA manufactured by JEOL). This confirmed that the polyamide-based rubber elastomer powder was spherical in shape. Moreover, the average degree of circularity of the polyamide-based rubber elastomer powder was measured using an image analysis-type particle size distribution measurement apparatus (Microtrac PartAn SI manufactured by MicrotracREL Corporation). As a result, the average degree of circularity of the polyamide-based rubber elastomer powder was measured as 98. Furthermore, to measure the 10% displacement compression strength of the polyamide-based rubber elastomer spherical powder, a compression test was performed using the micro-compression tester MCT-W500 manufactured by Shimadzu Corporation. As a result, the 10% displacement compression strength of the polyamide-based rubber elastomer powder was measured as 0.9 MPa.

Examples 1 and 2, and Comparative Examples 1 to 3

[Production of Epoxy Resin Compositions]
Each of the epoxy resin compositions was produced by homogeneously mixing the components in the amounts (mass ratio) shown in Table 1, and then thoroughly degassing the mixture.

The components shown in Table 1 are as follows:
Epoxy resin: Bis-A-type epoxy resin (JER grade 828, manufactured by Mitsubishi Chemical Corporation)
Polyamide-based rubber elastomer powder: the polyamide-based rubber elastomer powder produced in [Production Example of Polyamide-Based Rubber Elastomer Powder] above
Polyamide powder: 12 nylon particles (SP-10 manufactured by Toray, Industries, Inc.)
Synthetic rubber: Hypro CTBN 1300X8 (manufactured by PTI Japan Ltd.)
Curing accelerator: 2-ethyl-4-methylimidazole (CUREZOL 2E4MZ manufactured by Shikoku Chemicals Corporation)

[Evaluation of Properties]
(1) Tensile Shear Adhesion Strength to Aluminum Sheet
Each of the epoxy resin compositions obtained in Examples 1 and 2, and Comparative Examples 1 to 3 was applied to an aluminum sheet (JIS A1050P) (size: 2×25×100 mm) such that the adhesive portion became a 12.5×25 mm rectangle, and this aluminum sheet was bonded to another aluminum sheet. The resulting material was heated at 80° C. for 1 hour, at 100° C. for 1 hour, and at 150° C. for 2 hours to cure the epoxy resin composition, thereby preparing a test sample for measuring the tensile shear adhesion strength. The aluminum sheet surface was cleaned with acetone and dried to prepare the test sample for measuring the tensile shear adhesion strength.

A tensile shear adhesion test was performed on the adhesion test sample, using a tensile testing machine (AGS-X manufactured by Shimadzu Corporation) at a grip distance of 100 mm and a test speed of 5 mm/min. Based on the adhesive area and the measurement value of the maximum strength at break, the tensile shear adhesion strength to the aluminum sheet was calculated. The results are shown in Table 1.

(2) Peel Strength on Copper Foil
Copper foil was cut into a size of 5 cm or more×5 cm or more, and the preservative was cleaned off with acetone. The copper foil was then etched with 10% nitric acid for 30 seconds and washed with distilled water, and then dried at 60° C. to prepare a test sample. Each of the epoxy resin compositions obtained in Examples 1 and 2, and Comparative Examples 1 to 3 was applied to an aluminum sheet, and the copper foil was placed over the aluminum sheet. The resulting material was heated at 80° C. for 1 hour, at 100° C. for 1 hour, and at 150° C. for 2 hours to cure the epoxy resin composition, and then cut into a width of 1 cm with a cutter to prepare a test sample for measuring the peel strength on the copper foil.

Subsequently, a 90 degree peel strength was measured for the test sample for measuring the peel strength, using a tensile testing machine (AGS-X manufactured by Shimadzu Corporation) at a test speed of 50 mm/min. The results are shown in Table 1.

(3) Storage Modulus at −30° C. (Flexibility in Low-Temperature Environment)
Each of the epoxy resin compositions obtained in Examples 1 and 2, and Comparative Examples 1 to 3 was poured into a TPX mold (spacer: silicone rubber sheet, 1 mm T), and cured by heating at 80° C. for 1 hour, at 100° C. for 1 hour, and at 150° C. for 2 hours, to prepare a test sample for dynamic viscoelasticity measurement. Storage modulus was measured in tensile mode at a frequency of 1 Hz, −50 to 300° C., and a heating rate of 10° C./min. Based on the value of the storage modulus at −30° C., flexibility at the low temperature was evaluated. The results are shown in Table 1.

TABLE 1

|  | Example 1 | Example 2 | Comparative Example 1 | Comparative Example 2 | Comparative Example 3 |
| --- | --- | --- | --- | --- | --- |
| Epoxy Resin (part(s) by mass) | 100 | 100 | 100 | 100 | 100 |
| Polyamide-Based Rubber Elastomer Powder (part(s) by mass) | 5 | 30 | — | — | — |
| Polyamide Powder (part(s) by mass) | — | — | — | 5 | — |
| Synthetic Rubber (part(s) by mass) | — | — | — | — | 5 |
| Curing Accelerator (part(s) by mass) | 3 | 3 | 3 | 3 | 3 |
| Tensile Shear Adhesion Strength (MPa) to Aluminum Sheet | 8 | 9 | 4 | 5 | 3 |
| Peel Strength (N/cm) on Copper Foil | 10 | 11 | 6 | 6 | 4 |
| Storage Modulus at −30° C. (Flexibility in Low-Temperature Environment) | 1.5 | 1.2 | 2.6 | 2.7 | 1.5 |

The invention claimed is:

1. An epoxy resin composition comprising:
(A) an epoxy resin, and
(B) a polyamide-based rubber elastomer powder,
wherein the polyamide-based rubber elastomer powder is spherical,
wherein the polyamide-based rubber elastomer powder has a volume average particle diameter of 1 to 25 μm wherein the polyamide-based rubber elastomer powder is spherical and composed only of a block copolymer with a structure represented by the following general formula:

-[(A)-(X)-(E)]-, wherein (A) denotes an amide unit; (E) denotes an ether unit and (X) denotes a linking group that binds the amide unit and the ether unit, wherein the linking group is —CO—NH—, and wherein the polyamide-based rubber elastomer powder is contained in an amount of 1 to 50 parts by mass per 100 parts by mass of the epoxy resin.

2. An adhesive comprising the epoxy resin composition according to claim 1.

3. The adhesive according to claim 2, wherein the adhesive is for an electronic material.

4. A method of adhering articles together comprising using the adhesive according to claim 2.

5. The epoxy resin composition according to claim 1, wherein the polyamide-based rubber elastomer powder has a volume average particle diameter of 1.5 to 20 μm.

6. The epoxy resin composition according to claim 1, wherein a polyamide-based rubber elastomer constituting the polyamide-based rubber elastomer powder has a flexural modulus of 900 MPa or less.

7. A cured product of the epoxy resin composition according to claim 1.

8. A material comprising the epoxy resin composition according to claim 1, wherein the material is selected from the group consisting of a material for a structure, a composite material, a carbon fiber composite material, a semiconductor sealing material, a potting material, a substrate material, a lamination material, a coating material, and a paint.

9. A method of manufacturing an adhesive, a material for a structure, a composite material, a carbon fiber composite material, an adhesive for an electronic material, a semiconductor sealing material, a potting material, a substrate material, a lamination material, a coating material, or a paint, the method comprising obtaining the epoxy resin composition according to claim 1.

* * * * *